United States Patent [19]

Koetzle

[11] 4,016,408
[45] Apr. 5, 1977

[54] METHOD AND ARRANGEMENT FOR SUPERVISING POWER SUPPLY SYSTEMS

[75] Inventor: Gunther W. Koetzle, Ostfildern, Germany

[73] Assignee: International Business Machines Corporation, Armonk, N.Y.

[22] Filed: Dec. 8, 1975

[21] Appl. No.: 638,253

[30] Foreign Application Priority Data

Dec. 12, 1974 Germany .......................... 2458736

[52] U.S. Cl. ............................. 235/153 A; 323/20
[51] Int. Cl.² ...................................... G06F 11/00
[58] Field of Search ... 235/153 A, 153 AC, 153 AE, 235/153 R; 340/172.5; 317/9 R, 9 AC; 323/20; 324/73 R

[56] References Cited

UNITED STATES PATENTS

| | | | |
|---|---|---|---|
| 3,167,685 | 1/1965 | Bade et al. | 340/172.5 |
| 3,624,617 | 11/1971 | Putterman et al. | 340/172.5 |
| 3,801,963 | 4/1974 | Chen | 340/172.5 |
| 3,815,014 | 6/1974 | Davis et al. | 323/20 |
| 3,867,618 | 2/1975 | Oliver et al. | 235/153 AC |
| 3,937,937 | 2/1976 | McVey | 340/172.5 |

*Primary Examiner*—Charles E. Atkinson
*Attorney, Agent, or Firm*—Frederick D. Poag

[57] ABSTRACT

A method and apparatus for monitoring and controlling a plurality of power supplies in a computer or similar complex electronic apparatus provides the steps of normalizing each power supply output according to a common nominal value, comparing the normalized values to a reference having values according to the normalized upper and lower limits specified for each power supply, and conducting a quantative measurement of out-of-tolerance test values. The specific upper and lower tolerance values for each normalized output are stored in digital form and the measurement of an out-of-tolerance reading is by comparison to a digital ramp extending only from the specific maximum or minimum tolerance threshold which is exceeded. The testing of plural power supplies having the same upper or lower normalized tolerance can be conducted as a group of tests against the same reference.

16 Claims, 6 Drawing Figures

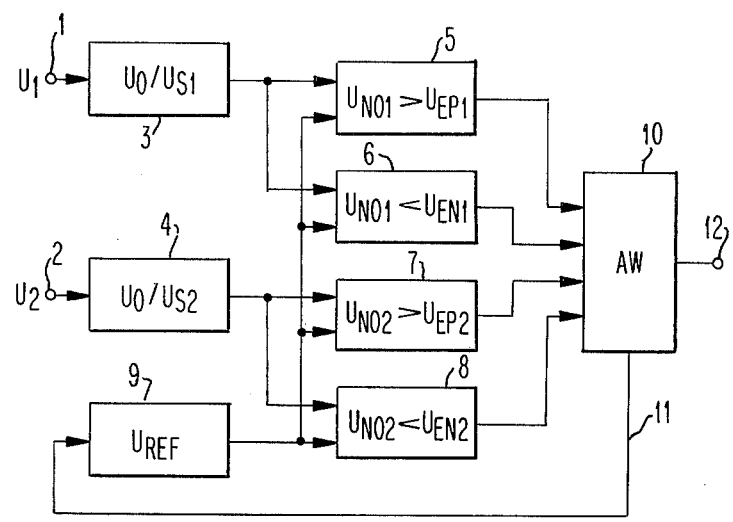
FIG. 1
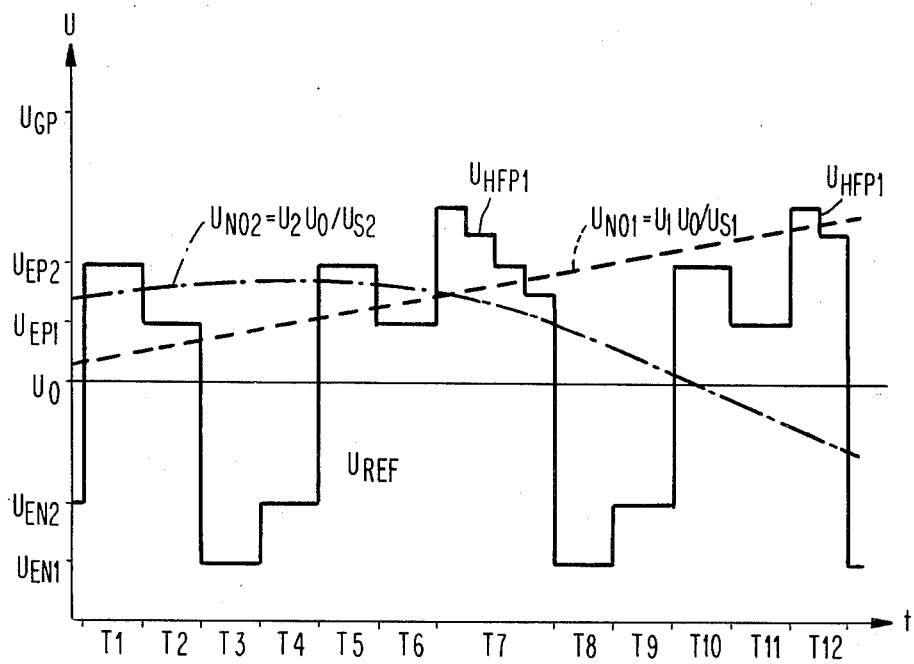
FIG. 2
FIG. 2A

METHOD AND ARRANGEMENT FOR SUPERVISING POWER SUPPLY SYSTEMS

BACKGROUND OF THE INVENTION

1. Field of the Invention

This invention relates to power supplies for complex electronic equipments such as data processing systems, and more particularly to an improved measurement and control method and apparatus for monitoring and controlling a large plurality of diverse power supplies in such a system, utilizing digital techniques and facilities which are inherent to such a data processing system.

2. Description of the Prior Art

The monitoring and control prior art is highly developed and contains many examples of systems which scan a multiplicity of test points looking for an out-of-tolerance value and which take some action upon the finding of one, such as the logging of the event, sounding of an alarm, or the like, as may be appropriate to the application.

In some cases automatic, selective test techniques have been applied to data processing system power supplies; one example is shown in U.S. Pat. No. 3,867,618. The prior art also includes teachings such as that set forth in U.S. Pat. No. 3,815,014 wherein diverse power supply outputs are normalized before being operated upon for power system feedback control. In spite of this state of prior art, there exists a need for simple, accurate and speedy monitoring and control in the power systems of complex electronic equipments such as data processing systems where, as the technology advances, the semiconductor and other relatively low voltage, low power and delicate circuit devices driven by the power system require very stringent adherence to voltage specifications. Thus, if voltage requirements are exceeded, destruction of these delicate devices is likely to result, and if low voltage occurs, data processing errors and loss of actively stored data may result.

SUMMARY OF THE INVENTION

The plurality of the circuits, components, manufacturing technologies and basic materials used in a modern electronic computer, or in a comparable device equipped with semiconductor elements, which are to be found in one single system can demand a multitude of supply voltages with different nominal values and different acceptable tolerances. It is a primary object of the invention to make the supervision and, if necessary, the control of such a multitude of voltages uncomplicated and feasible and to adapt it to the digital operation of the computers so that the computer itself can supervise its own power supply.

The measures in accordance with this invention permit a rapid, repeated scanning of all supply voltages to be checked in a given system. An output signal emitted in the process shows the exceeding of an extreme value based on the acceptable tolerance of each individual voltage. These extreme values are selected in such a manner that, within their limits, the supply voltage can vary without causing any data processing failures or apparatus damage. It is only at a substantially higher or lower voltage that the working safety is endangered, or that components are destroyed. It is an object of the invention to monitor the supplies whereby, before these dangerous voltages are reached, the respective supply voltage can be re-controlled or switched off.

In accordance with one aspect of the invention, a variable reference value is changed in steps in accordance with the acceptable extreme values, whereby a simple comparison of the reference values with the (normalized) supply voltages to be checked effects the emission of a binary signal which can be used for further processing, e.g. in a computer. A specific advantage of the system consists in that the checking of the supply voltages to be checked takes place at a relatively high frequency, i.e., in short intervals. In accordance with another aspect of the invention, a further measurement can follow wherein, employing the same techniques and equipment but operating a lower scanning frequency, precise determination of individual voltages is performed. Preferably, this exact measuring is performed selectively for only those voltages which exceed the acceptable extreme values.

In accordance with a still further aspect of the invention, power supplies having like percent tolerances from their individual nominal values are grouped for testing against common reference value. Since the supply outputs under test are first normalized in accordance with the ratio between their respective nominal values and the nominal value of the reference, the supplies grouped for testing in this manner need not have the same nominal value; therefore, the whole process is speeded and simplified.

The foregoing and other objects, features and advantages of the invention will be apparent from the following more particular description of preferred embodiments of the invention, as illustrated in the accompanying drawings.

DESCRIPTION OF THE PREFERRED EMBODIMENT

While the invention has been particularly shown and described with reference to preferred embodiments thereof, it will be understood by those skilled in the art that various changes in form and detail may be made therein without departing from the spirit and scope of the invention.

In the drawings:

FIG. 1 shows one embodiment of the invention in simplified diagramatic form.

FIG. 2 is a time diagram of different functions of the arrangement of FIG. 1.

FIG. 2A is a multiplex diagram referenced to FIG. 2.

DETAILED DESCRIPTION

Figure 1A:
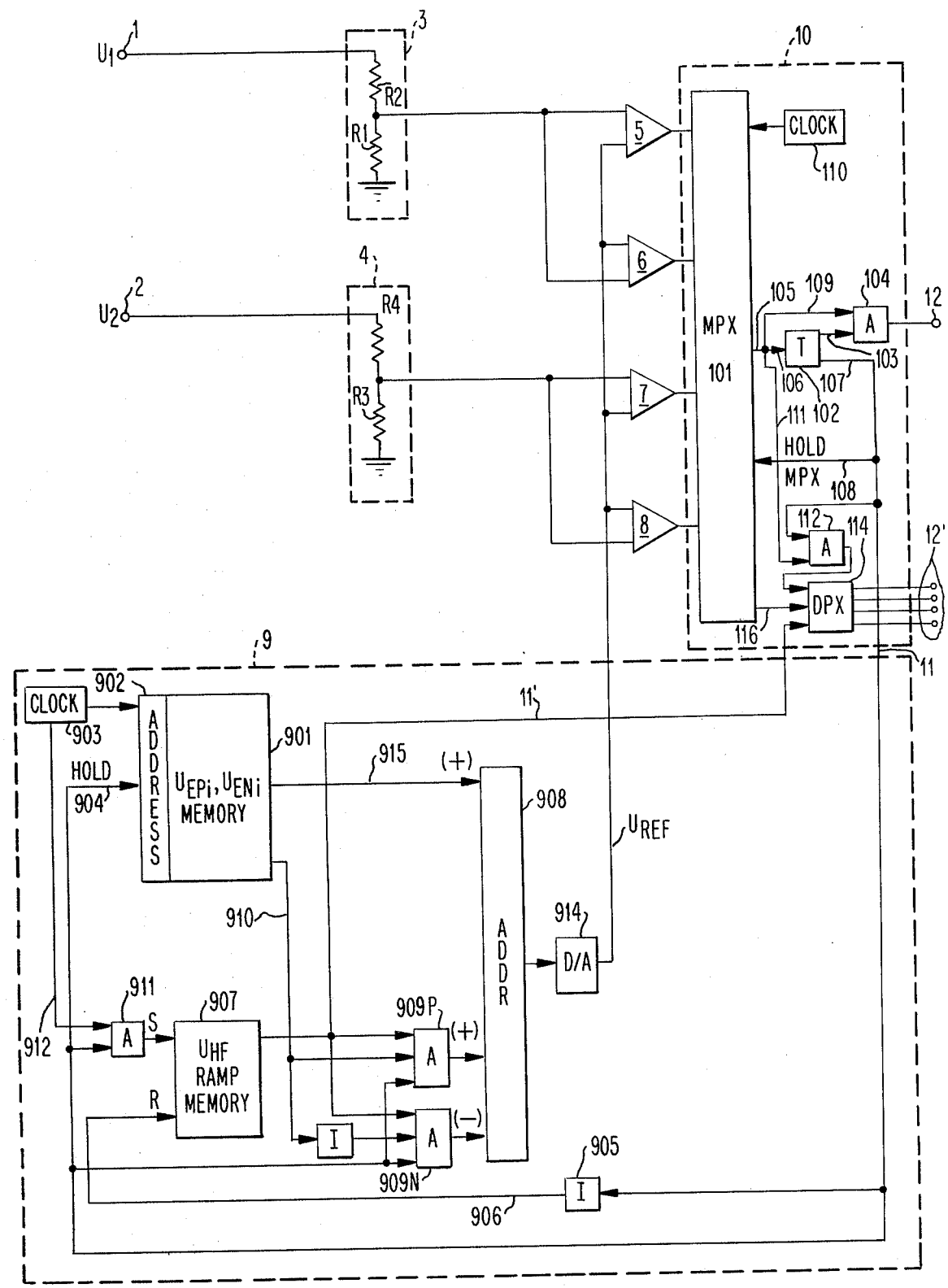
FIG. 1A illustrates, as an example, apparatus in accordance with the embodiment of FIG. 1, again in diagramatic form.

The two input terminals 1 and 2 of the circuit shown in FIG. 1 receive the two input voltages $U_1$ and $U_2$ which are generated by a power supply unit. It is assumed that the desired values $U_{S1}$ and $U_{S2}$ of the two supply voltages show neither the same value nor, owing to the characteristics of the circuit to be fed, have the same acceptable tolerances. Thus, for the correct supply of the connected receiving system, both relatively and absolutely differing tolerance limit values $U_{EPi}$ and $U_{ENi}$ ($i$ being the indicating flag number of the respective supply voltage $U_i$) may be specified. Two normalizing circuits 3 and 4 are provided whereby input signals $U_1$ and $U_2$ are respectively normalized to the same nominal value $U_0$. Circuits 3 and 4 can consist of increase and decrease units; in the least complicated case they are designed as voltage dividers as described hereinafter in conjunction with FIG. 1A. The normalizing circuits "multiply" the respective input signals with the quotient of nominal value $U_0$ and the respective desired value $U_{Si}$. Thus, the signal $U_{N01} = U_1 \cdot U_0/U_{S1}$ is available at the output of circuit 3, said signal being applied to the two comparators 5 and 6. Whereas comparator 5 emits an output signal each time input signal $U_{N01}$ is higher than a signal $U_{EP1}$ simultaneously applied at its other input and referred to below in detail, comparator 6 shows an output signal each time the same input signal $U_{N01}$ is lower than a signal $U_{EN1}$ simultaneously applied at its other input.

Similarly, input signal $U_2$ applied to terminal 2 of normalizing circuit 4 is brought to normalized value $U_{N02}$. This normalized value is applied to the two comparators 7 and 8, the first emitting an output signal when $U_{N02}$ is higher than a signal $U_{EP2}$ simultaneously applied to its other input, and comparator 8 emitting an output signal when its input signal is lower than a simultaneously applied signal $U_{EN2}$.

Voltages $U_{EPi}$ and $U_{ENi}$ applied to the second inputs of comparators 5, 6, 7, and 8 are generated by a reference voltage source 9. Between the two extreme values $U_{EP1}$ and $U_{EN1}$ normalized supply voltage $U_{N01}$ can remain without there being the danger of a failure in the connected receiver apparatus. In the same manner, the normalized voltage $U_{N02}$ can be between the upper extreme or tolerance value $U_{EP2}$ and the lower extreme or tolerance value $U_{EN2}$. In connection with FIG. 2, a more detailed reference will be made to the function of these voltages.

The output lines of comparators 5, 6, 7, and 8 are connected to an evaluator circuit 10 which at its output 12 can emit a signal when an upper or a lower limit of the acceptable extreme values has been exceeded. In the present case, this circuit is designed in such a manner that via line 11 it applies to reference voltage source 9 a signal switching the latter to a further measuring cycle which serves for a more precise determination of the supply voltage going above or beneath the extreme values.

The time diagram of FIG. 2 explains the operation of the arrangement of FIG. 1. The abscissa of this representation is the time axis on which, in the present case, only individual time intervals $t_n$ are given. The ordinate shows voltage designations which are specified below:

$U_{EN}$ — acceptable lower extreme value of $U_1$ referred to $U_0$.

$U_{EN2}$ — the same for $U_2$ $U_0$ — nominal value to which all values are referred and normalized.

$U_{EP1}$ — acceptable upper extreme value of $U_1$ referred to $U_0$.

$U_{EP2}$ — the same for $U_2$ $U_{GP}$ — an upper danger value at which components can be destroyed.

The acceptable extreme values $U_{EPi}$ and $U_{ENi}$, being the indicating tag number of the respective supply voltage, are derived from the acceptable desired value deviations upward $U_{Pi}$ and downward $U_{Ni}$, referred to the respective desired values $U_{Si}$ as follows:

$$U_{EPi} = U_0 + U_{Pi} \cdot U_0/U_{Si} = U_0(1+U_{Pi}/U_{Si})$$
$$U_{ENi} = U_0 - U_{Ni} \cdot U_0/U_{Si} = U_0 (1 - U_{Ni}/U_{Si})$$

FIG. 2 shows a total of three functions. The step function, drawn in a continuous line, represents the reference voltage $U_{REF}$ which is supplied by the circuit marked 9 in FIG. 1. In a dashed line the normalized supply voltage $U_{N01}$ is represented which, in the given example, is rising linearly at least approximatively. A curved course is shown by the dash-dotted second supply voltage $U_2$ which equally normalized is drawn as $U_{N02}$. Normalization is effected by circuits 3 and 4 in FIG. 1 by means of which input values $U_i$, in accordance with the function $U_{N0i} = U_i \cdot U_0/U_{Si}$, are decreased or increased. Voltage $U_{N01}$ is thus applied to the two comparators 5 and 6 of FIG. 1, whereas voltage $N_{N02}$ is applied to comparators 7 and 8. Applied to the second inputs of comparators 5 to 8 there are the values of the step-like reference voltage $U_{REF}$. FIG. 2A shows time-multiplexed utilization MPX of the outputs of comparators 5 to 8 by evaluator circuit 10. During the time interval marked T1 on the time axis, reference voltage $U_{REF}$ is at the upper extreme value $U_{EP2}$ which voltage $U_{N02}$ must not exceed. Since $U_{N02}$ does not exceed $U_{EP2}$ at this time, comparator 7 of FIG. 1 does not respond. During time interval T2, the reference voltage is at value $U_{EP1}$. As normalized voltage $U_{N01}$ is below this value comparator 5 does not emit an output signal. Since, in this example, reference voltage $U_{REF}$ is also applied to comparator 7 during interval T2, comparator 7 will emit an output signal to evaluation circuit 10. In that case, the input signal is filtered out by evaluation circuit 10 according to the multiplex sequence shown in FIG. 2A. Thus, $N_{N02}$ may exceed the extreme values belonging to supply voltage $U_{N01}$ without causing an output at 12.

Another possibility, not shown, consists in applying to the comparators only those enabling and reference voltages $U_{REF}$ which are relevant for the comparison to be made. Applied to the hitherto used example this means that during interval T1 only comparator 7, and during interval T2 only comparator 5 are operative and receive input signals from reference voltage source 9. This different design of the circuit affects neither the nature of the process according to the invention, nor the basic function of the arrangement.

During time interval T3, reference voltage $U_{REF}$ reaches the lowest extreme value $U_{EN1}$. As shown by FIG. 2, the upper and lower extreme values for supply voltage $U_1$ are asymmetrical to the desired value. This is expressed by the differing spacing of values $U_{EP1}$ and $U_{EN1}$ compared with nominal value $U_0$ in the figure. Although such a case appears relatively rarely, it will be seen by this example that its solution does not present any problems. On the other hand, however, reference value $U_{EN2}$ applied during time interval T4 is a limit which is symmetrical with respect to the respective positive extreme value $U_{EP2}$. In intervals T3 and T4, the acceptable minimum values were not exceeded. Nor does reference voltage $U_{REF}$ applied during interval T5, said voltage being in turn at value $U_{EP2}$ and thus indicating the beginning of a new measuring cycle (of the first type), effect the emission of an output signal indicating the exceeding of an acceptable extreme value. It is only during interval T6 that normalized supply voltage $U_{N01}$ exceeds its associated upper extreme value $U_{EP1}$, upon which, by evaluation circuit 10 via control line 11, a signal is applied to reference voltage source 9, said signal causing the latter to generate a fine-division and higher-frequency step voltage $U_{HFP1}$ for a more precise determination of the normalized supply voltage exceeding the acceptable extreme value. This further measuring cycle which is performed during time interval T7 now permits the more detailed determination of $U_{No1}$ analogously to the process described, by a comparison (comparator 5 in FIG. 1) of the normalized supply voltage with the individual voltage steps of $U_{REF}$. For this purpose, the multiplex sequence in the operation of evaluation circuit 10 is held at "5" so that the output of comparator 5 remains available for evaluation.

In time interval T8, reference voltage $U_{REF}$ drops to value $U_{EN1}$ again and thus repeats the process executed in interval T3. The same applies to intervals T9 and T10.

During time interval T11, an exceeding of the acceptable upper extreme value $U_{EP1}$ by the normalized supply voltage $U_{No1}$ is again detected and subsequently, as subsequently to interval T6, another measuring cycle during interval T12 is initiated. As soon as within this measuring cycle the exact height of the differing supply voltage $U_{No1}$ has been found reference voltage $U_{REF}$ again drops to the lower extreme value $U_{EN1}$ and the multiplex function steps to "6", as during intervals T3 and T8. The repeated detection and measuring of a supply voltage exceeding the acceptable extreme values can, for instance, be employed for emitting, in the manner of a control circuit, a control signal which influences a control element altering the differing supply voltage. The output signal can also be used for switching-off the differing supply voltage prior to its having reached a danger value $U_{GP}$. Both measures prevent the appearance of failures or defects due to the supply voltages in the supply circuits.

For the present example there exists a multitude of variations. The more precise measuring, i.e. another measuring cycle, can be performed immediately after the exceeding of an acceptable extreme value has been detected. It is also possible, irrespective of whether an exceeding above or below an extreme value has been detected, to carry out a second measuring cycle after each first measuring cycle. In this manner, the first and second measuring cycle alternate respectively so that a more precise determination of the voltage, e.g. during a test run, can be made by expert staff. Display can take place via output units of a connected data processing system.

The generation of reference voltage $U_{REF}$, as in circuit 9 of FIG. 1, can take place in that the individual values of the step curve are in a digital storage which is connected via a digital-to-analog converter to the comparators which at their respective other input receive the supply voltages to be checked, i.e. their normalized values, respectively. The use of a digital storage offers the advantage of storing the voltages over a discretionary period with the necessary precision and of permitting, nevertheless, a simple exchange of the values to be used. Furthermore, when the supervision system is used for the current supply of a digital electronic computer, the reference voltage source can already be provided in the computer in the same technology. Similar facts apply to evaluation circuit 10 which can also be integrated in such a system with particular advantage when it is designed in digital technology.

For purposes of illustration only, a very simple scheme for the implementation of the embodiment of FIG. 1, in conformity with the foregoing, is illustrated in FIG. 1A. In this figure, the normalization circuits 3 and 4 are shown as resistive dividers R1, R2 and R3, R4, respectively. The ratio $U_0/U_{S1}$ providing the scaling factor in normalization circuit 3 is given by the ratio $R1/(R1 + R2)$. In like manner, the ratio $U_0/U_{S2}$ providing the scaling factor in normalization circuit 4 is provided by the ratio $R3/(R3 + R4)$. The comparator circuit 5, 6, 7 and 8 are shown as operational amplifiers. Amplifier 5 yields an up or significant output when the input from circuit 3 exceeds $U_{REF}$ and operational amplifier 6 yields an output when the signal level from circuit 3 is less than signal $U_{REF}$. Evaluation circuit 10 is shown to include a multiplexor 101 and cycle catagorizing logic, in this case a single input flip-flop or trigger 102. When trigger 102 is in its normal, set condition it provides an output on line 103 thereby conditioning AND circuit 104. Then, if an output from one of the comparators passes through the multiplexor to its output line 105, that signal is propagated via 109 through AND circuit 104 to output terminal 12. The signal on line 105 is also applied to the complementing input 106 of trigger 102 so as to initiate switching of the trigger to its reset condition. This terminates the signal on its set output 103 and provides a signal on its reset output 107. If desired, the input 106 to trigger 102 can be through a delay circuit (not shown) to retard the switching of trigger 102 by a short but specified time to assure that the output pulse at terminal 12 has an appropriate duration before trigger 102 switches.

Referring to FIGS. 2 and 2A, the example shown provides that the detection of an overvoltage at time T6 stops the multiplexor at the position in which it has gated the output of comparator 5 to output terminal 12 and holds it at that position while the high frequency digital ramp $U_{HFP1}$ is executed to perform a measurement during time T7. When the high frequency digital ramp $U_{HFP1}$ intercepts $U_{No1}$ in that example, the multiplexor is allowed to continue to its next step which is to connect comparator 6 to the output during time T8. In the schematic example of FIG. 1A, it is trigger output 107 which operates, via control line 108, to hold multiplexor 101 from advancing and also provides a control level to line 11 to initiate the ramp operation of circuit 9. Reference circuit 9 is illustrated in FIG. 1A to comprise an addressable digital memory 901, the readout address control 902 of which is stepped by clock 903 to address the storages in memory 901 sequentially in a repetitive sequence. Clock 903 operates in synchronism with the clock 110 of multiplexor 101, so that the two operate in cadence. In the normal tolerance testing cycle, the successive outputs $U_{EP2}$, $U_{EP1}$, $U_{EN1}$, $U_{EN2}$ issue from memory 901 to adder 908 and pass therethrough to digital to analog converter 914 to become $U_{REF}$.

However, when a measuring cycle is needed, a signal provided by trigger output 107 operates not only to hold the multiplexor via line 108, it also transmits a control level via line 11 to the HOLD control 904 of memory address control 902. Thus, whenever multiplexor 101 is held in a fixed position such as time T7, memory 901 is held at its last output, $U_{EP1}$ in that example. It will be observed in FIG. 2 that the digital staircase $U_{HFP1}$ is, in effect, a decreasing digital value superimposed on $U_{EP1}$. Although not shown in FIG. 2, it will be obvious that the measurement of an out-of-tolerance value in the negative going direction would be executed by such a staircase subtracted (i.e., extending downwardly from) $U_{EN2}$ or $U_{EN1}$ as the case may be. In FIG. 1A this staircase is provided by a small memory 907 having storages which, in sequence, contain the digitally representations of the staircase. These digital staircase signals are admitted selectively to adder 908 whenever there is a signal on line 11, via one of AND gates 909P or 909N. The selection of AND gates 909P and 909N is made by a signal on output 910 from memory 901 indicative of whether the memory position addressed is one corresponding to a maximum or minimum tolerance. At the same time, AND circuit 911 energizes the stepping input S of the addressing input of ramp memory 907 at the high frequency illustrated in FIG. 2. In this circuit, this fast-step frequency is provided by an additional output on line 912 from clock 903. If gate 909P is enabled, the staircase value from ramp memory 907 is added in adder 908 to the value standing at the output 915 of memory 901. If gate 909N is enabled, the staircase value is subtracted. Any suitable internal construction of adder 908, such as one supplying the indicated + and − signs to the operands furnished to the adder can be employed. When the signal $U_{NOi}$ being measured intercepts the ramp, the comparator standing connected through multiplexor 101 to trigger 102 operates to complement the trigger back to its normal state. The control level on line 11 falls, whereby AND circuits 909P, 909N and 911 are no longer enabled, and reset input R of memory 907 is energized via invert circuit 905 and line 906, resetting ramp memory 907 to its initial address in readiness for its next use. The signal on line 910 can be derived in any convenient manner such as from a flag bit in each addressable position in memory 901 which does not form part of the value supplied to adder 908 via output 915 but is indicative of whether that value is associated with an upper or lower tolerance. Thus, if the value is associated with an upper tolerance $U_{EP}$ a "1" from the flag bit position in memory 91 present on line 910 as an up signal will enable AND gate 909P, and gate 909N will be enabled in the opposite case.

To keep the drawing simple, initializing circuits for multiplexor 101, trigger 107 and memories 901 and 907 have been omitted from FIG. 1A, since these and other details are obvious. Also obvious is the fact that the measuring staircase signal provided by ramp memory could be ascending instead of descending, with appropriate changes in the evaluation logic. It will be recalled that FIG. 1A is given merely as a simple illustration; the functions of the elements of FIG. 1 obviously can be carried out with any degree of sophistication desired utilizing the facilities of a data processor employing suitable microprogramming and the like.

Figure 3:
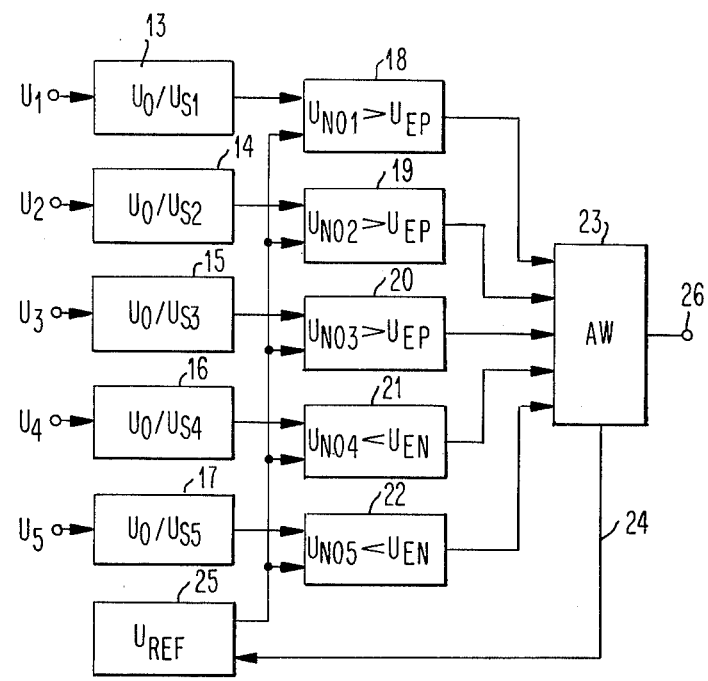
FIG. 3 illustrates another embodiment of the invention.

The circuit shown in FIG. 3 presents some differences compared with the arrangement of FIG. 1. It is suitable for the checking of five supply voltages $U_1$ to $U_5$ whose desired values $U_{S1}$ to $U_{S5}$ may differ from each other. Normalization circuits 13 to 17 are designed as decreasing or increasing units which normalize the incoming supply voltages to the given nominal value $U_0$. It is now further assumed that the three supply voltages $U_1$, $U_2$, and $U_3$ may show the same relative upward percent deviations from the desired value. The normalization of the three voltages effects a generalization of the originally different extreme upper values as relative to their reference value they each are in the same position. This means that it is sufficient to generate one single upper extreme value voltage $U_{EP}$ for controlling all three voltages $U_1$ and $U_3$.

It is analogously assumed that the two remaining voltages $U_4$ and $U_5$ which may show differing desired values $U_{S4}$ and $U_{S5}$ deviations of the desired value. In spite of the differing lower extreme values of the two supply voltages the lower extreme value voltage $U_{EN}$ referred to nominal value $U_0$ is consequently identical for both supply voltages.

The arrangement of FIG. 3, therefore, permits the checking of a total of five supply voltages with different desired and extreme values by means of only two reference voltage steps. It is obvious that thus a considerably high frequency check of the voltage deviations can be performed so that failures can be detected within a minimum of time. It should furthermore be pointed out that comparators 18, 19 and 20 can be combined in such a manner that they compare the normalized input voltages $U_{N01}$ to $U_{N03}$ with one single input voltage, the upper extreme value $U_{EP}$. Analogously, comparators 21 and 22 can be joined into one common circuit. Evaluation circuit 23 with its output 26 and its connecting line 24 to reference voltage source 25 can be designed, like the latter, in accordance with the principles described in connection with FIG. 1.

Figure 4:
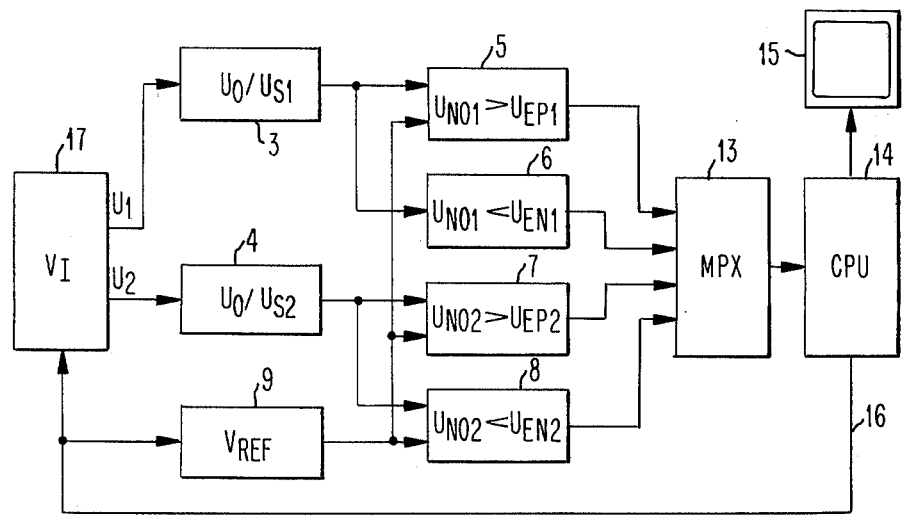
FIG. 4 is illustrative of a control circuit on the basis of the arrangement of FIG. 1.

The arrangement of FIG. 4 is a development of the circuit shown in FIG. 1. For that reason, part of the reference numbers used are the same for both figures; the respective circuit elements, therefore, do not require any further specifications. The two supply voltages $U_1$ and $U_2$ are provided by a power supply system 17. They are applied to normalization circuits 3 and 4 whose outputs are connected to the inputs of comparators 5 to 8 as described in connection with FIG. 1. The respective second inputs of the comparators are at the output of a reference voltage source 9 which generates a reference voltage signal $U_{REF}$, e.g. as shown in FIG. 2. The output lines of the comparators are connected to a multiplex circuit 13 which scans the individual output signals and transmits the scanning results to a computer unit 14 marked CPU. Evaluation circuit 10 of FIG. 1 has thus been replaced (and enlarged) by multiplex circuit 13 and computer unit 14. Computer 14 applies output signals via line 16 both to reference voltage source 9 and to power supply system 17. The signals applied to reference source 9 have the same function as described in connection with FIGS. 1 and 2. On the other hand, the signals of computer 14, which are applied to power supply system 17, are control signals which influence control elements for supply voltages $U_1$ and $U_2$. Consequently, the arrangement of FIG. 4 is a closed control circuit causing the control and/or switching-off of supply voltages $U_1$ or $U_2$ as soon as the supervision detects an exceeding of the acceptable extreme values. For example, the detection of an over or under voltage can be used to adjust the internal control circuits of the out-of-tolerance supply. The position of the multiplexor at the time of detection identifies which measurement is concerned and the content of the ramp memory at the time of intercept with the normalized supply value being measured is indicative of the amount of over or under voltage, on the normalized basis. If desired, the CPU can count the number of out-of-tolerance indications for a given supply and take action to adjust it only after the indication repeats, in a second test, for example. Such a second test can be taken immediately or in the next series of tests. Thus, nonsignificant singly occurring transients will not cause an unneeded adjustment or shut-off.

Screen unit 15 is shown in FIG. 4 to indicate the possibility of providing an external display of occurring failures. Screen unit 15 may also be used by technical experts for checking the system and for precisely specifying the individual voltages and their succession with respect to time. In that connection, the course of the various functions as shown by FIG. 2 can be used as an illustration thereof. Again, it is a simple matter to gate $U_{REF}$, in either its digital or analog form, to unit 15 to provide abcissa information thereto, while the system clock provides the ordinate input and the CPU superimposes other identifying information. It is equally possible to log the information for future use.

For purposes of illustration, FIG. 1A shows schematic circuitry for the utilization of the measurement information provided. When the ramp $U_{HF}$ intercepts the normalized value being measured, the resulting comparator signal through multiplexor 101 is fed via line 111 to AND circuit 112. Since trigger 102 is providing a signal on line 107, AND 112 is enabled, and activates demultiplexor 14 to pass the instantaneous value of the ramp source, furnished via line 11', to one of the outputs 12'. Demultiplexor 114, operating in synchronism with multiplexor 101 under the control of input 116, functions to distribute the ramp value information to one of the outputs 12' according to the state of multiplexor 101.

In the showing of FIG. 1A, output 12' has as many sub-outputs as there are comparators 5 to 8. Accordingly, the identity of the sub-output which is active signifies which supply $U_1$ or $U_2$ is being measured and whether the deviation is relative to the upper or lower tolerance of that supply. When this information is used to control the supply, as indicated in FIG. 4, this information can be used to indicate whether the exceeding of the tolerance is so great that the supply should be shut down, or whether its control should be adjusted and, if so, by how much and in what direction. Simple logic in the supply, not shown, can be used for this function. The presence of a high order bit in the feedback information indicates a large deviation and can be used to turn off the supply. Otherwise, the information can be used to merely turn-up or turn-down the supply. For example, the information can be converted to analog form and utilized to alter the reference which controls a voltage regulator in the supply. One example of a simple control of this general kind is shown in the aforecited U.S. Pat. No. 3,815,014.

From the foregoing, it will be evident that methods and systems in accordance with the invention can take many forms and are adaptable to flexibility in use. For example, in the arrangement of FIg. 1A, the value corresponding to $U_0$ could be supplied separately to adder 908 and only the smaller quantities representing the difference between $U_{EPi}$ and $U_0$ on the one hand and between $U_{ENi}$ and $U_0$ on the other stored in memory 901. So also, the testing and measuring sequences can be varied as desired. For example, as indicated in FIG. 3, it is possible to check only the plus tolerances of some supplies and only the minus tolerances of others. In this way, only the desired readings are taken, and the process is speeded.

In summary, by providing two distinct kinds of tests, i.e. (1) a simple threshold check and (2) an accurate ramp-compare measurement only when needed for precise feed-back control, by grouping like tests together (e.g. like direction tests as in FIGS. 2 and 3 and identical percent tolerances as in FIG. 3), and by use of digital step functions referenced to a common normalized value for both kinds of tests, very fast and continuous monitoring and control of a data processing apparatus power system is possible. Since the values shown in FIG. 2 are all normalized with respect to $U_0$, the contents of the memories 901 and 907 (FIG. 1A) are representative of percent factors rather absolute values. Accordingly, the data provided are readily usable in the percent control of differing power supplies in the system. By these means, the reliability of the power, and thus of the whole data processing system, can be enhanced.

Throughout the drawings, single line connections have been shown. It will be understood that certain of the data desirably constitutes a plurality of digital bits in parallel. Therefore, some of the lines, such as 116, 11', 915 and 16, for example, may be implemented in the form of multiconductor cables. So also, gates such as 909P and 909N can, in fact, represent arrays of gates, one for each digital order. These and other details, such as pulse shaping and anti-slivering circuits, etc., are well understood in the art and are omitted from the examples shown for simplicity and clarity.

While the invention has been particularly shown and described with reference to preferred embodiments thereof, it will be understood by those skilled in the art that various changes in form and detail may be made therein without departing from the spirit and scope of the invention.

What is claimed is:

1. A method of supervising power supply systems supplying a plurality of supply voltages with different desired values and different acceptable extreme tolerance values, characterized in that all actual values of the supply voltages are normalized by respective scale factors to a uniform nominal value, that in a repeated tolerance checking cycle a variable reference value is generated which step by step passes through all acceptable extreme values, said extreme values being referred to nominal value, that the normalized supply voltages is compared with their associated extreme values and a respective output signal is emitted each time the normalized actual value deviates from said nominal value by more than its associated acceptable extreme value.

2. The method in accordance with claim 1, characterized in that a further testing operation follows the checking operation during which the upward or downward exceeding of the acceptable extreme values has been detected.

3. The method in accordance with claim 1, characterized in that upon the appearance of an output signal indicating the upward or downward exceeding of the acceptable extreme values a further measuring operation is initiated during which the amount of the normalized actual value outside the acceptable extreme values is determined.

4. The method in accordance with claim 3, characterized in that during said further measuring operation the reference value is varied in small steps.

5. The method in accordance with claim 4, characterized in that during said further measuring operation the reference value is varied in a continuous staircase of steps superimposed on the normalized extreme value which has been exceeded.

6. The method in accordance with claim 1 characterized in that going above or below one of the acceptable extreme values, effects a switching-off of the respective supply voltage.

7. The method in accordance with claim 2 characterized in that the going above or below one of the acceptable extreme values by the same supply voltage, during at least two successive operations, effects the switching-off of the supply voltage.

8. The method in accordance with claim 3 characterized in that the result of said measuring operation is utilized in a closed control circuit which acts on a control element for altering the actual value going above or below the acceptable extreme values.

9. Power supply supervising means comprising,
a plurality of scaling circuits for normalizing respective power supply outputs to be supervised,
means applying the normalized supply voltage appearing at the output of each of said circuits to a respective input of a series of comparators, and
means connecting the other input of each comparator to a reference voltage source,
said comparator emitting an output signal each time the normalized supply voltage connected thereto exceeds applied reference voltage in a given direction, and
a circuit for evaluating the output signals emitted by the comparators.

10. Means in accordance with claim 9,
wherein to each said scaling circuit two of said comparators are connected, one of which indicates the exceeding in upward direction of the reference voltage by the normalized supply voltage connected thereto, whereas the other emits an output signal when the exceeding takes place in downward direction.

11. Means in accordance with claim 9, characterized in that the evaluation circuit is connected to the power supply system for controlling the supply voltages.

12. Means in accordance with claim 9, characterized in that the evaluation circuit is connected for control to the reference voltage source for exercising said reference voltage source in accordance with a value measuring search pattern.

13. Means in accordance with claim 9, characterized in that the evaluation circuit comprises a multiplex circuit connected to scan the outputs of said comparators, and
a computer receiving said outputs from said multiplexor.

14. A power system for incorporation into a data processing system comprising,
power supply means providing a plurality of controllable outputs,
scanning means for sampling said outputs in groupings of said outputs according to similar tolerances,
test means receiving sample signals from said scanning means corresponding to said outputs, said test means comprising
multiple threshold detector means for comparing said sample signals to individually predetermined tolerance digital values, said detector means providing an interrupt signal to arrest said scanning means when a sample signal exceeds the corresponding tolerance, indicating an out-of-tolerance condition,
measuring means responsive to said interrupt signal to further evaluate the relationship of the indicated out-of-tolerance sample signal and the corresponding tolerance level,
and feedback control means responsive to said measuring means for altering the operation of said supply means.

15. A system according to claim 14, further including scaling means interposed between said power supply outputs and said scanning means operative to normalize said sample signals according to a common nominal value.

16. A system according to claim 15, wherein said measuring means comprises the comparison means of said threshold detector means and includes digital ramp means operative to superimpose a digital staircase upon said digital tolerance values.

* * * * *